(12) United States Patent
Bonhôte et al.

(10) Patent No.: US 10,270,030 B2
(45) Date of Patent: Apr. 23, 2019

(54) ELECTROPLATED PHASE CHANGE SWITCH

(71) Applicant: Western Digital Technologies, Inc., Irvine, CA (US)

(72) Inventors: Christian R. Bonhôte, Sunnyvale, CA (US); Jeffrey Lille, Sunnyvale, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/285,610

(22) Filed: Oct. 5, 2016

(65) Prior Publication Data

US 2017/0025476 A1    Jan. 26, 2017

Related U.S. Application Data

(63) Continuation of application No. 14/788,183, filed on Jun. 30, 2015, now Pat. No. 9,595,669.

(51) Int. Cl.
*H01L 27/24* (2006.01)
*H01L 45/00* (2006.01)

(52) U.S. Cl.
CPC .............. *H01L 45/16* (2013.01); *H01L 27/24* (2013.01); *H01L 27/249* (2013.01); *H01L 45/04* (2013.01); *H01L 45/06* (2013.01); *H01L 45/1226* (2013.01); *H01L 45/1233* (2013.01); *H01L 45/1253* (2013.01); *H01L 45/143* (2013.01); *H01L 45/144* (2013.01); *H01L 45/1608* (2013.01)

(58) Field of Classification Search
CPC .............. H01L 27/2418; H01L 27/2427; H01L 27/249; H01L 27/2409; H01L 45/146; H01L 45/144; H01L 45/1226; H01L 45/08; H01L 45/143; H01L 45/06; H01L 45/085; H01L 45/1233; H01L 45/1683
USPC ............................................ 257/5, 315, 324
See application file for complete search history.

(56) References Cited

U.S. PATENT DOCUMENTS 6,294,425 B1    9/2001    Hideki
7,687,830 B2    3/2010    Pellizzer et al.
7,943,420 B1    5/2011    Breitwisch et al.
(Continued)

FOREIGN PATENT DOCUMENTS

JP        200981251    4/2009
WO      2014/036480 A1    3/2014

OTHER PUBLICATIONS

Korean Office Action (with attached English translation) for Application No. 10-2016-0082752; dated May 23, 2017; 4 total pages.
(Continued)

*Primary Examiner* — Changhyun Yi
(74) *Attorney, Agent, or Firm* — Stoel Rives LLP

(57) ABSTRACT

The present disclosure generally relates to a structure, system, and method for manufacturing an electrical component for a memory device. For example, depositing alternating layers of conductive and insulator materials over an etch stop layer to create a vertical stack, etching a trench through the vertical stack to expose the etch stop layer, electroplating the conductive layers using a plating material based on a desired electrical behavior, and forming a connection between the plating materials for each of the conductive layers.

20 Claims, 12 Drawing Sheets

(56) References Cited

U.S. PATENT DOCUMENTS

| | | | |
|---|---|---|---|
| 8,173,987 B2 | 5/2012 | Lung | |
| 8,373,151 B2 | 2/2013 | Parkinson | |
| 8,530,875 B1 | 9/2013 | Chang et al. | |
| 8,642,985 B2 | 2/2014 | Chen et al. | |
| 8,716,780 B2 | 5/2014 | Kellam et al. | |
| 8,841,649 B2 | 9/2014 | Pio | |
| 2008/0073635 A1 | 3/2008 | Kiyotoshi et al. | |
| 2008/0164493 A1 | 7/2008 | Bedell et al. | |
| 2008/0175032 A1* | 7/2008 | Tanaka | G11C 5/025 365/51 |
| 2009/0071836 A1 | 3/2009 | Huang et al. | |
| 2009/0230458 A1 | 9/2009 | Ishiduki et al. | |
| 2009/0257269 A1* | 10/2009 | Shepard | G11C 11/412 365/148 |
| 2009/0261314 A1 | 10/2009 | Kim et al. | |
| 2010/0072452 A1* | 3/2010 | Kim | H01L 45/04 257/4 |
| 2011/0037042 A1* | 2/2011 | Breitwisch | H01L 27/2436 257/2 |
| 2011/0165728 A1 | 7/2011 | Greely et al. | |
| 2011/0309319 A1 | 12/2011 | Quick et al. | |
| 2013/0248801 A1* | 9/2013 | Yamamoto | H01L 27/249 257/4 |
| 2013/0279245 A1* | 10/2013 | Pop | B82Y 10/00 365/163 |
| 2014/0061574 A1* | 3/2014 | Pio | H01L 27/10 257/5 |
| 2014/0131784 A1 | 5/2014 | Davis et al. | |
| 2014/0273314 A1 | 9/2014 | Hashim | |
| 2014/0332748 A1* | 11/2014 | Khoueir | H01L 27/2481 257/4 |
| 2014/0361239 A1 | 12/2014 | Ramaswamy et al. | |

OTHER PUBLICATIONS

Geoffrey W. Burr, "Access devices for 3D crosspoint memory," 040802-1 J. Vac. Sci. Technol. B 32(4), Jul./Aug. 2014 2166-2746/ 2014/32(4)/040802/23/ 2014 American Vacuum Society <http://researcher.watson.ibm.com/researcher/files/us-gwburr/JVSTB_2014.pdf>.

Bartlett, et al.; Materials Horizons; Non-Aqueous Electrodeposition of Functional Semiconducting Metal Chalcogenides: Ge2Sb2Te5 Phase Change Memory; dated Mar. 4, 2015; 7 total pages.

European Search and Examination Report for Application No. GB1611062.9; dated Oct. 17, 2016; 10 total pages.

Taiwanese Office Action for Application No. 105120808; dated Apr. 11, 2017; 9 total pages.

Office Action issued in Tiawanese Patent Application No. 105120808, dated Feb. 12, 2018 (6 pages).

* cited by examiner

ELECTROPLATED PHASE CHANGE SWITCH

CROSS-REFERENCE TO RELATED APPLICATIONS

This application is a continuation of co-pending U.S. patent application Ser. No. 14/788,183, filed Jun. 30, 2015, which is herein incorporated by reference.

BACKGROUND OF THE DISCLOSURE

Field of the Disclosure

Embodiments of the present disclosure generally relate to an electronic device, and more specifically, to a 3D array of electroplated phase change or ovonic threshold switches (OTS).

Description of the Related Art

Phase change memory (PCM) is a type of non-volatile memory technology. PCM is an emerging technology and a candidate for storage class memory (SCM) applications and a serious contender to dislodge NOR and NAND flash memory in solid state storage applications and, in the case of NAND flash, solid-state drives (SSDs). PCM functions based upon switching a memory cell, typically based on chalcogenides such as $Ge_2Sb_2Te_5$, between two stable states, a crystalline state and an amorphous state, by heating the memory cell. To heat the memory cell, an electrical current flows through the PCM cell.

An array of PCM cells arranged in an array, and each PCM cell may be coupled with a selecting switch such as an ovonic threshold switch (OTS). Word lines (WL) and bit-lines (BL) are arranged so that each memory cell can be programmed or queried. A row of PCM cells is activated by a single word line WL and each one of the PCM cells in that row will affect the bitline BL to which it is electrically connected according to the state of the PCM cells, i.e. according to the PCM cells being in their high (amorphous) or low (crystalline) resistance state.

SUMMARY OF THE DISCLOSURE

Certain embodiments of the present disclosure generally relates to a method for a method for fabricating an electroplated electrical component, comprising: depositing an etch stop layer over a substrate; depositing alternating layers of conductive and insulator materials over said etch stop layer to create a vertical stack; etching a trench through the vertical stack to expose the etch stop layer; forming an electrical network to electrically connect to a portion of said conductive layers; electroplating on said conductive layers in said trench using a plating material based on a desired electrical behavior of the electrical component; forming an electrical connection on the plating material in said trench to allow for electrical connection through said trench to said plating material; and removing said electrical network connection to the conductive layers.

Certain embodiments of the present disclosure generally relates to a structure for a vertical electroplated electrical component, comprising: an etch stop layer disposed over a substrate; a vertical stack comprising alternating layers of conductive and insulator materials over the etch stop layer, wherein: the vertical stack has at least one trench formed there through, the conductive layers are electroplated using a plating material based on a desired electrical behavior of the electrical component to form on a sidewall of said trench, a shape of said plating material is hemispherical, a thickness of said plating material is less than a width of said trench, a thickness of said plating material is less than a thickness of adjacent insulating layers in said trench; and a top contact metallic layer formed on the sidewall of said trench wherein said plating material is between said conductive layer and said top contact layer and wherein said top contact layer is connected to other adjacent electroplated structures in said trench.

Certain embodiments of the present disclosure generally relate to an electrical system, comprising: a storage device comprising at least one vertical array, each vertical array comprising a plurality of memory cells; and a selector device to electrically access the plurality of memory cells in said storage device; a first metallic material to vertically connect said vertical array of memory cells; and a second metallic material to connected to an in-plane conductor material which is orthogonal to said vertical array of memory cells, and wherein the vertical array of memory cells comprise: an etch stop layer over a substrate; a vertical stack comprising alternating layers of in-plane insulator material and said in-plane conductor material over the etch stop layer, wherein: the in-plane conductor and insulator layers are parallel with a surface of the substrate, the vertical stack comprising at least one trench formed there through, and the conductor layers are electroplated using the plating material, wherein the plating material is based on a desired electrical behavior of an electrical component to form on the sidewall of said trench.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Figure 1:
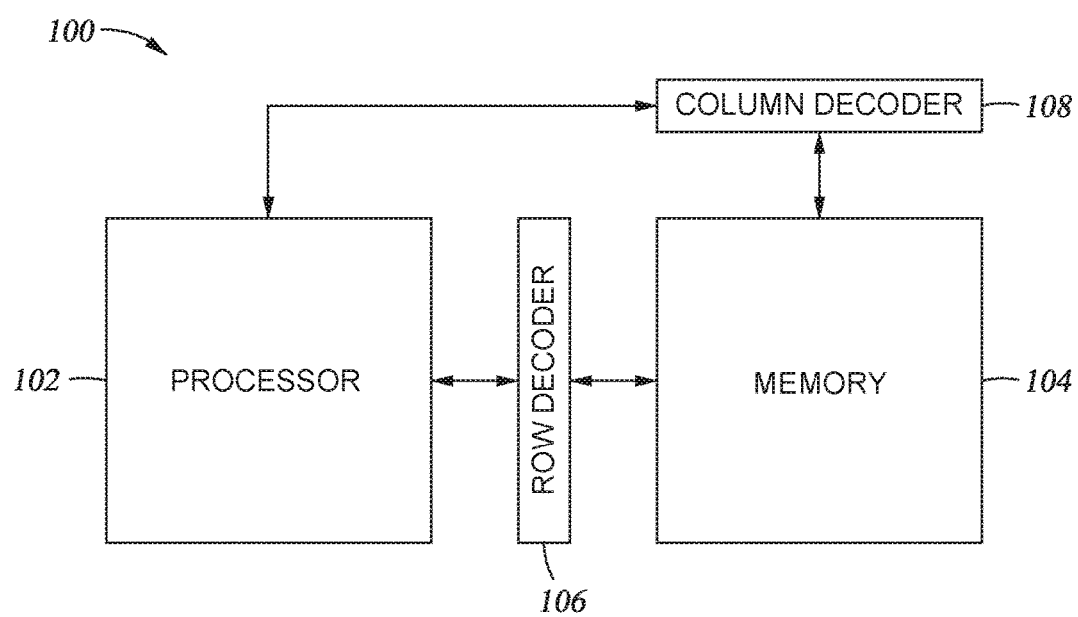
FIG. 1 is a block diagram of an example processing system.

FIG. 1 is a block diagram of a processing system 100 having a processing device 102 and memory device 104. The memory device 104 comprises memory cells that are arranged in an array formation of rows and columns. The processor 102 interfaces with the array of memory cells via a row decoder 106 and column decoder 108. Individual memory cells are controlled by word lines that may extend along the rows of the array and bit lines that may extend along columns of the array. A memory cell may exist at a junction between the word and bit lines. During a read/write cycle, a row decoder selects a row page of memory cells to be read from or written to. Likewise, the column decoder selects a column address of memory cells for the read/write cycle. In certain embodiments of the present disclosure, each memory cell (e.g., at a junction between the word and bits lines) may include at least one of a phase change memory (PCM) cell (e.g., using phase change material) or ovonic threshold switch (OTS).

FIGS. 2A-2J illustrate a structure and method for manufacturing an electrical component (e.g., a memory device), according to certain embodiments of the present disclosure.

Figure 2A:
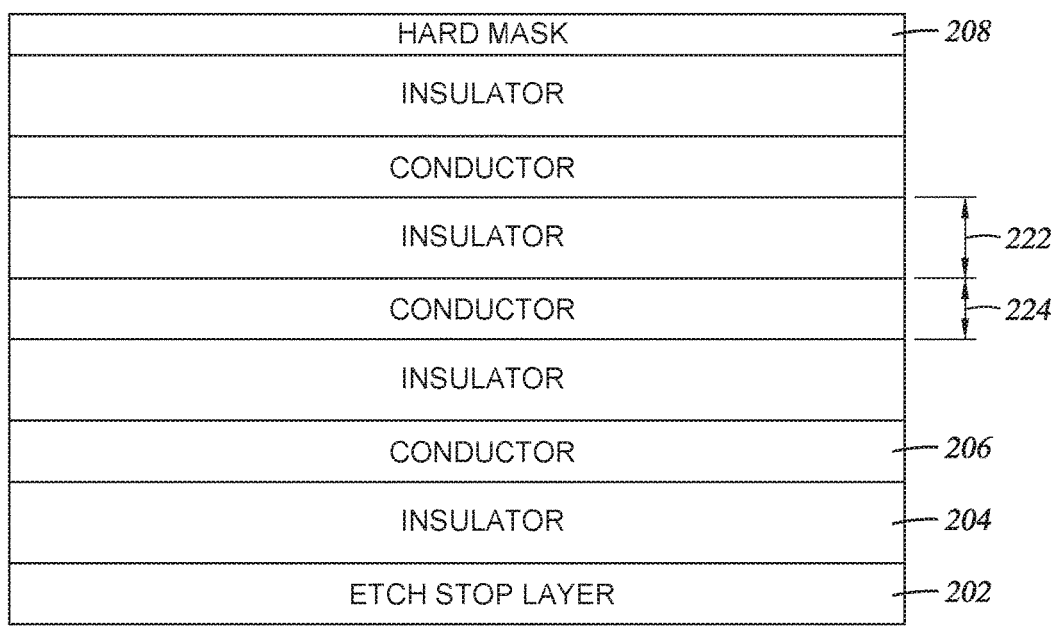
FIG. 2A illustrates an example vertical stack of alternating layers of conductive and insulator materials, in accordance with certain embodiments of the present disclosure.

For example, the method may involve depositing an etch stop layer 202 over a substrate, on which a vertical stack of conductor and insulator layers may be deposited, as is illustrated in FIG. 2A. In certain embodiments, the etch stop layer 202 can be made of any material that does not etch in a fluorine containing plasma, such as chrome, magnetic metal, or an oxide that does not etch in fluorine such as aluminum oxide. Over the etch stop layer, alternating layers of insulator materials 204 and conductor materials 206 may be deposited to form a vertical stack. The vertical stack may comprise any number of insulator and conductor layers, in an alternating fashion as illustrated. In certain embodiments, the insulator material can be silicon dioxide ($SiO_2$) and the conductor material may be doped silicon, molybdenum (Mo), or tungsten (W). In certain embodiments, the thickness of the insulator conductor layers may be the same. In certain embodiments, the thickness 222 of the conductive layer may be less than the thickness 224 of the insulator layers.

In certain embodiments, a layer of hard mask 208 is deposited over the vertical stack and is used as an etch mask. The hard mask may be made of chrome, or any material that does not etch in a fluorine containing plasma, for example.

Figure 2B:
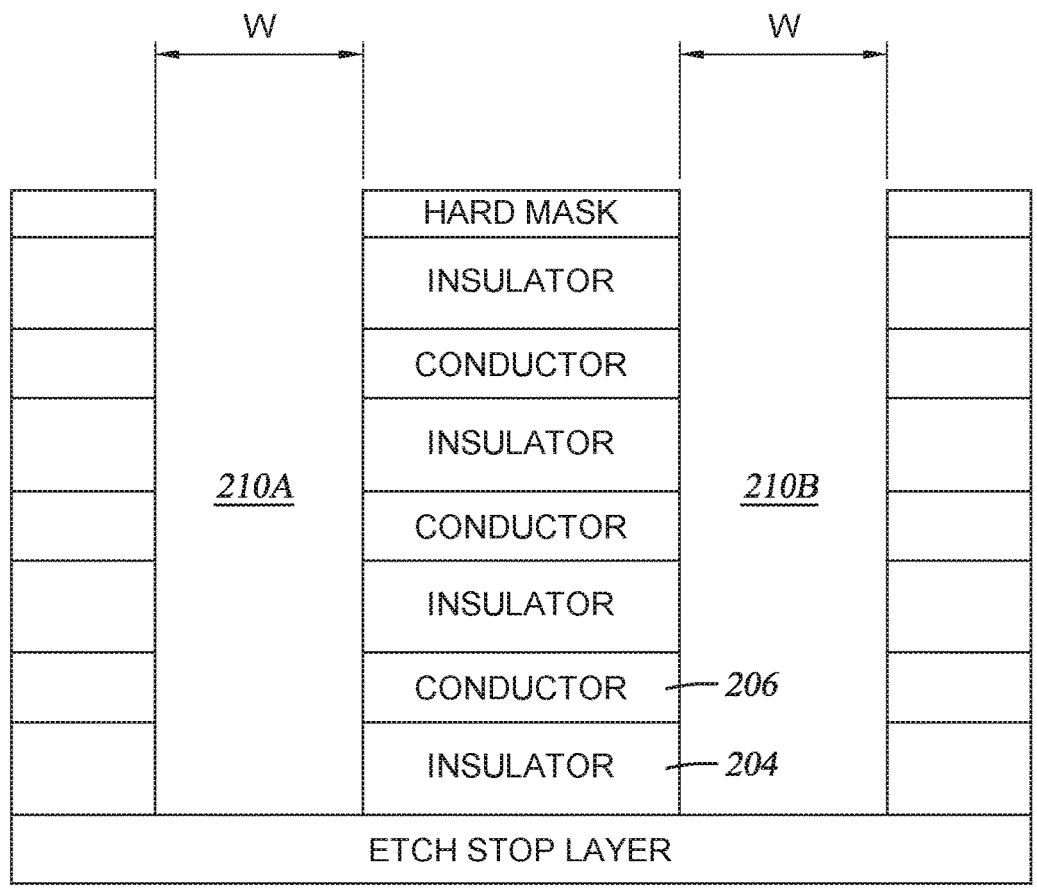
FIG. 2B illustrates two example vertical stacks of alternating layers of conductive and insulator materials, in accordance with certain embodiments of the present disclosure.

At this stage, one or more trenches may be formed within the vertical stack, as illustrated in FIG. 2B. For example, a masking layer may be deposited over the hard mask 208 in a pattern, leaving exposed portions of the hard mask layer where the one or more trenches are to be formed. Using an etch chemistry that will etch the exposed hard mask material, the exposed portion of the hard mask may be removed. At this stage, only portions of the vertical stack where a trench is to be formed are exposed, and other portions are covered by the hard mask material. Thus, using an etch chemistry that will etch the vertical stack materials, at least one trench 210A and 210B may be formed in vertical stack down to and exposing the etch stop layer. In certain embodiments, a reactive-ion etching (RIE) process may be used to form trenches 210A and 210B. Optionally, the hard mask 208 may be removed after the trenches are formed.

Figure 2C:
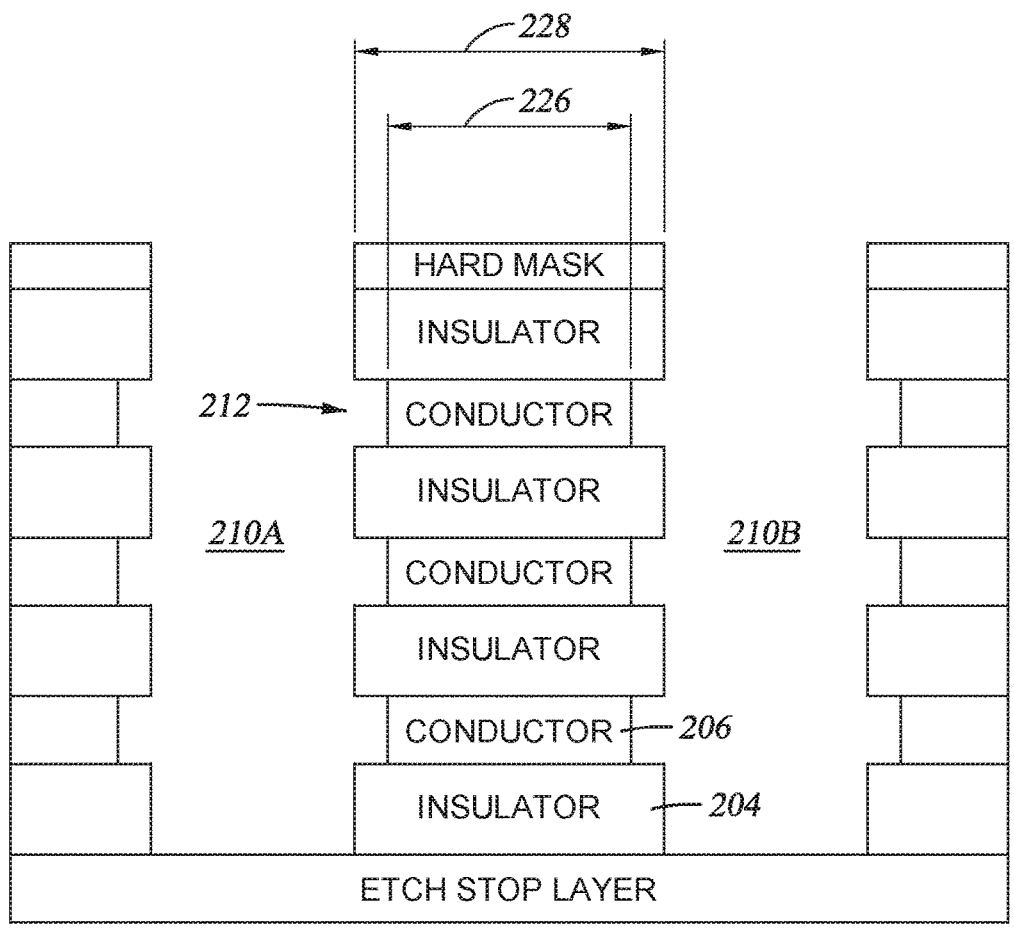
FIG. 2C illustrates the example vertical stacks of FIG. 2B with recessed layers of conductive material, in accordance with certain embodiments of the present disclosure.

In certain embodiments, the conductive layers, now exposed to the side walls of each trench 210A and 210B, may be recessed from the insulator layers, as illustrated in FIG. 2C. That is, a horizontal length 226 of each of the layers of conductive materials 206 may be shorter than a horizontal length 228 of each of the layers of insulator materials 204. For example, the sidewalls of each trench 210A and 210B may be exposed to a plasma etch process that selectively etches the conductive layers faster than the insulator layers. Therefore, recessed pockets 212 may be formed where the conductor layers are recessed from the trench walls a greater distance than the insulator layers. The recessed pockets allow for plating material to be formed on each conductor layer (as discussed in more detail with respect to FIG. 2E) such that the plating material for each conductor layer does not come in contact with plating material formed on an adjacent conductor layer. In certain embodiments, a slow wet etch may be used to form the recessed pockets 212.

Figure 2D:
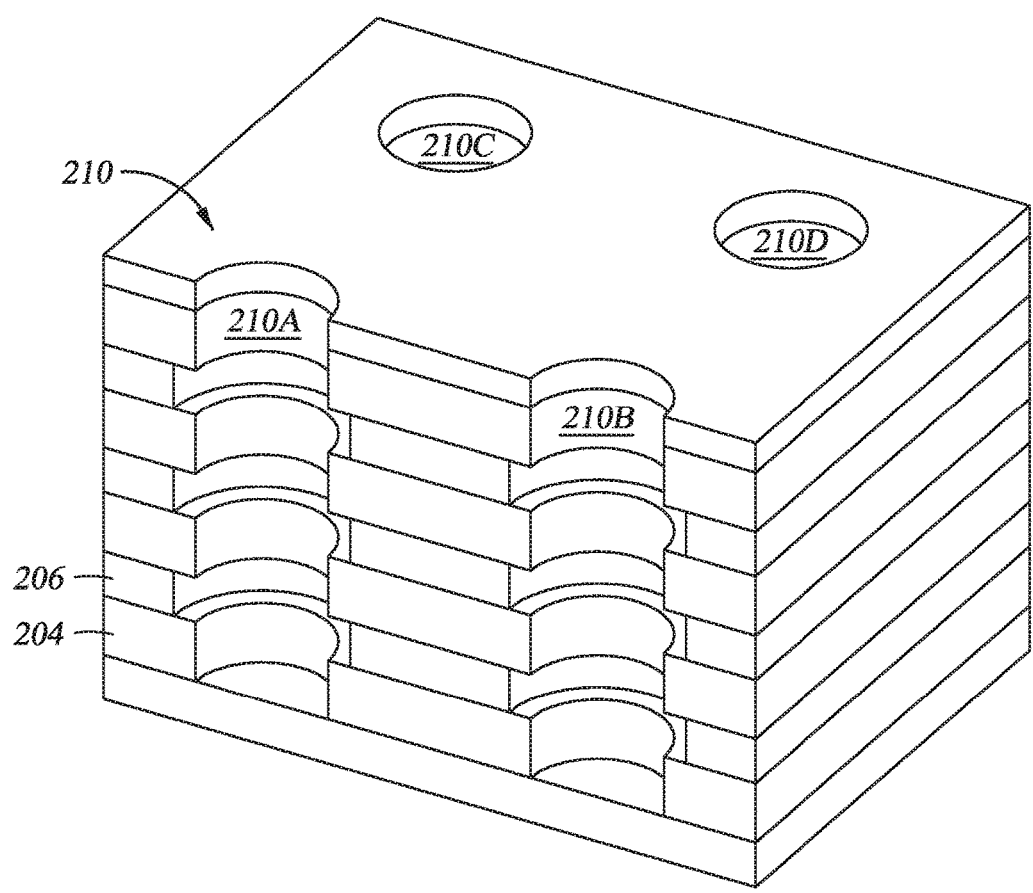
FIG. 2D illustrates a perspective view of the example vertical stacks of FIG. 2C, in accordance with certain embodiments of the present disclosure.

FIG. 2D illustrates a perspective view of the vertical stack of conductor layers 206 and insulator layers 204 comprising trenches 210A, 210B, 210C and 210D (collectively 210). In certain embodiments, each trench 210 may be a conical shape extending through the vertical stack of conductor and insulator materials and exposing the etch stop layer. In certain embodiments, each trench exposes a flat surface portion of the etch stop layer, as opposed to coming to a sharp point at the bottom of each trench.

Figure 2E:
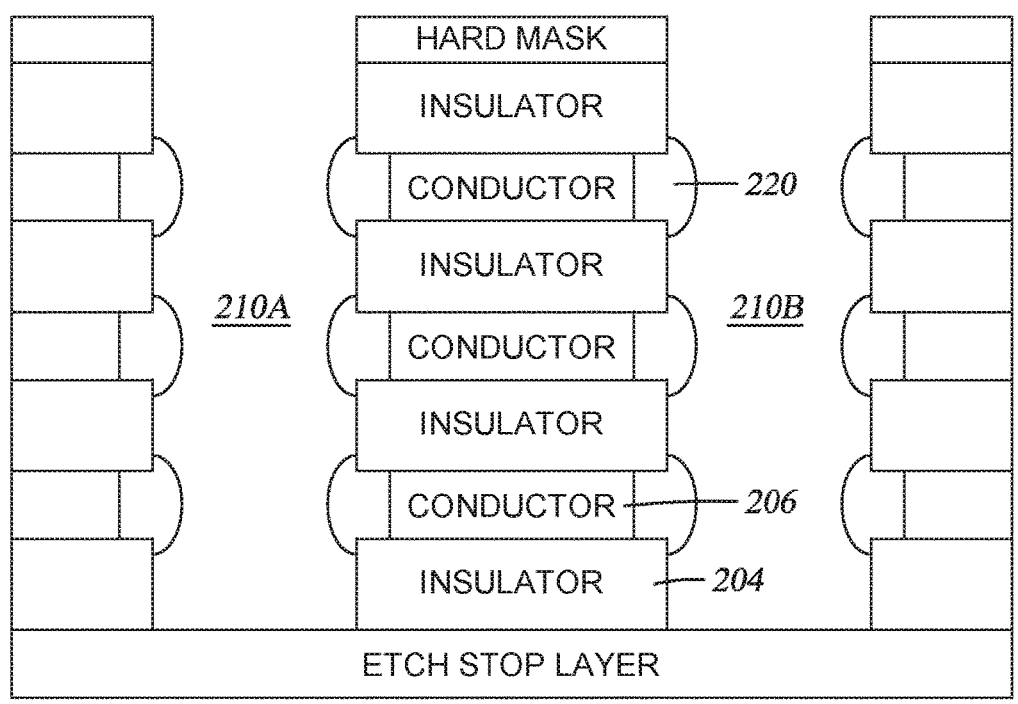
FIG. 2E illustrates the example vertical stack of FIG. 2C with plating material coupled to each of the conductive layers, in accordance with certain embodiments of the present disclosure.

As illustrated in FIG. 2E, the conductive layers may be plated using an electroplating process. Electroplating is a process that uses electric current to reduce dissolved metal cations so that they form a coherent metal coating on an electrode. To electroplate the conductive layers, the conductive layers of the vertical stack may be coupled to an electric network used to apply a voltage potential to the conductive layers, acting as the cathode during electrodeposition. The electrical network may be formed temporarily to electrically connect all the conductive layers that are to contain plating material. Each of the plating materials formed on the conductive layers may be an electroplated device (e.g., an electroplated phase change device). After the plating materials are formed, the electrical network may be removed to allow for addressable electroplated devices. Furthermore, the electrical resistance from the location on the substrate where the plating material is formed and the external power supply may be similar for all devices. The electrical resistance across this (temporary) electrical network is important prior to electroplating to ensure similar volume and composition of all the electroplated structures.

Depending on the parameters of electroplating, the plating material may have a hemispherical cross-section. Therefore, the thickest portion of the electroplated structure may be considered as the thickness of the electroplated structure for simplicity.

The thickness of the plating material may be less than the width of the trench to prevent adjacent plating material from joining. Furthermore, the thickness of the insulation layers between the conductive layers is important to prevent adjacent electroplated devices from joining in the vertical direction. Therefore, the plating materials (e.g., electroplated devices) may have a thickness that is less than the thickness of the adjacent insulator layers. In the event the insulator layers are not equal, the thinner insulator layer may set the limit for the thickness of the electroplated device.

In certain embodiments, an aqueous bath electroplating process may be used to form the plating material. In other embodiments, an ionic solution may be used during the electroplating process. The material used for plating the conductive layers (e.g., material in the bath during electrodeposition) may be based on a desired electric behavior (e.g., a phase change material or ovonic threshold switch (OTS)), as discussed in more detail below. It should be noted that the hard mask layer may be removed or disconnected from any power supply such that no plating material is formed on top of the vertical stack. In certain embodiments, each plug may be formed to have similar size, thickness, and composition. After the plating material is formed, the conductive layers may be electrically isolated by disconnecting them from the electric network.

Figure 2F:
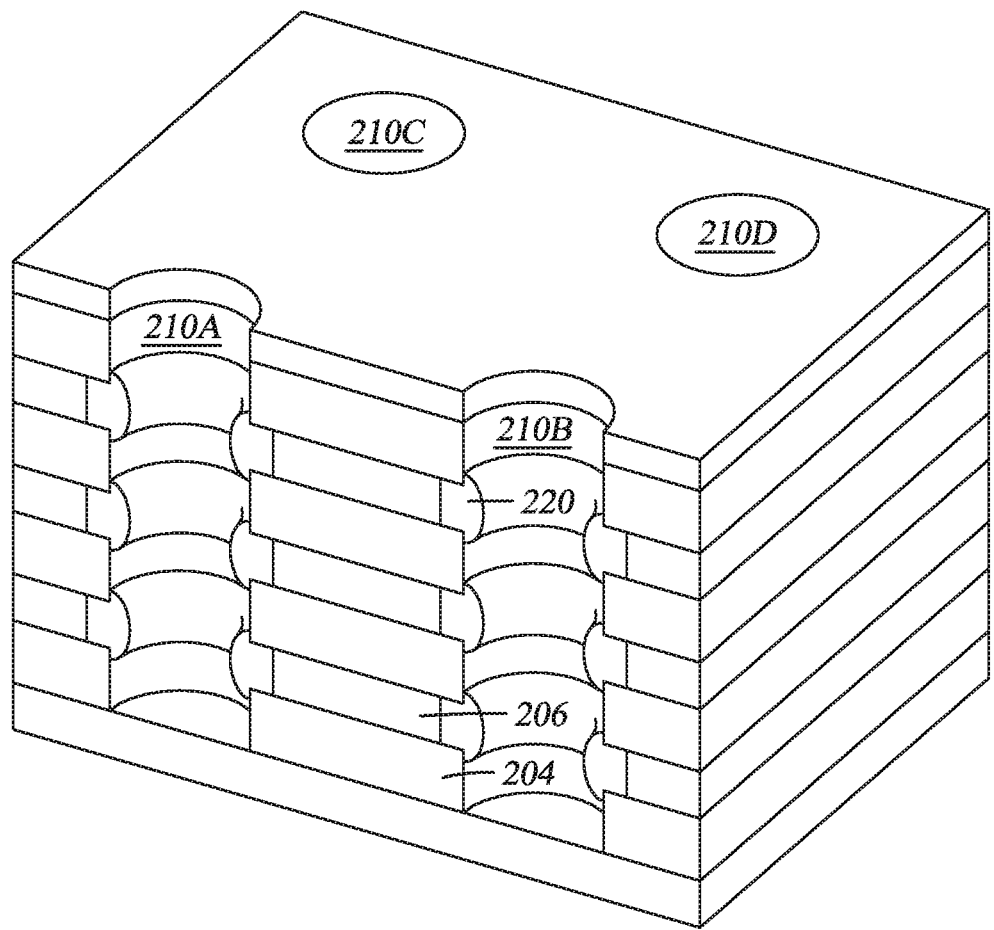
FIG. 2F illustrates a perspective view of the example vertical stack of FIG. 2E, in accordance with certain embodiments of the present disclosure.

FIG. 2F is a perspective view of the vertical stack of FIG. 2E, in accordance with certain aspects of the present disclosure. As illustrates, each of the plugs 220 are formed around a circumference of trenches 210 and along an edge of the conductor layers 206.

Figure 2G:
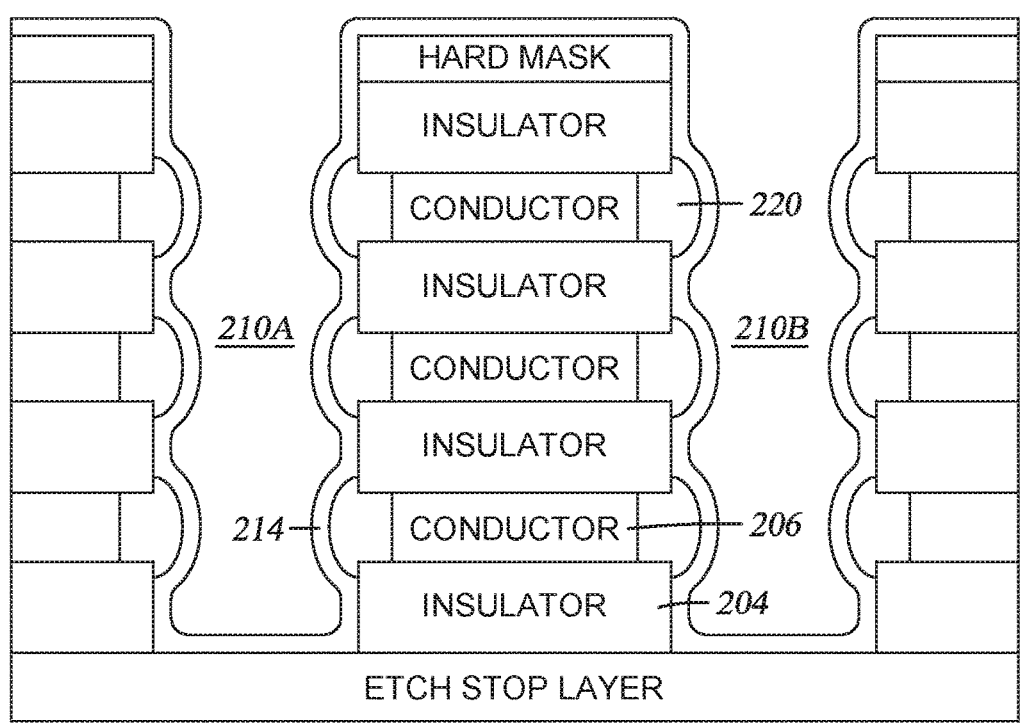
FIG. 2G illustrates the example vertical stack of FIG. 2E with a contact layer connecting each of the plating materials, in accordance with certain embodiments of the present disclosure.
Figure 2H:
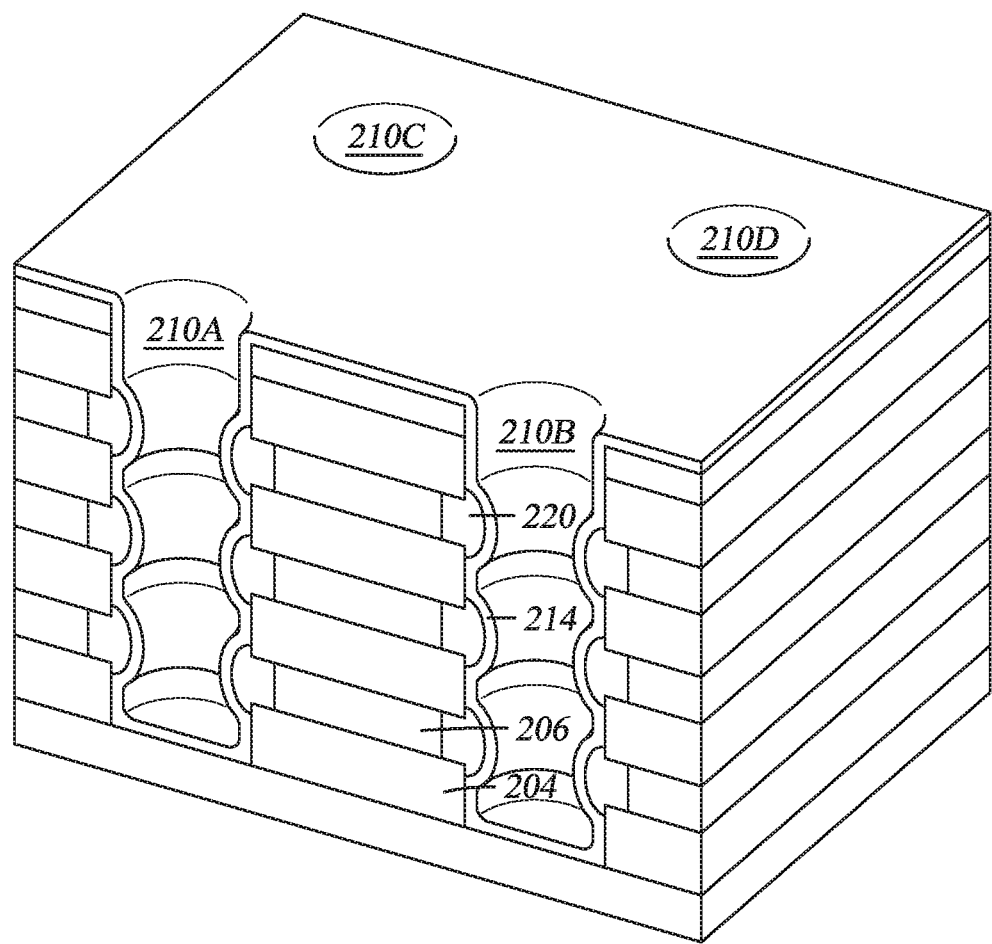
FIG. 2H illustrates a perspective view of the example vertical stack of FIG. 2G, in accordance with certain embodiments of the present disclosure.

As illustrated in FIG. 2G, each of the plugs 220 may be connected to a top contact strip 214, representing a diffusion barrier and ohmic connection to a via which may be formed in the trench (e.g., during a later processing step). The contact strip 214 may be made of a conductive material such as metal (e.g., tungsten, platinum or copper). In certain embodiments, the trench may be filled with conductive material after the contact strip 214 is formed. FIG. 2H is a perspective view of the vertical stack represented in FIG. 2G. As illustrated, the contact strip 214 may be formed via a conductive layer formed over each of the plating materials 220 and over the vertical stack.

Figure 2I:
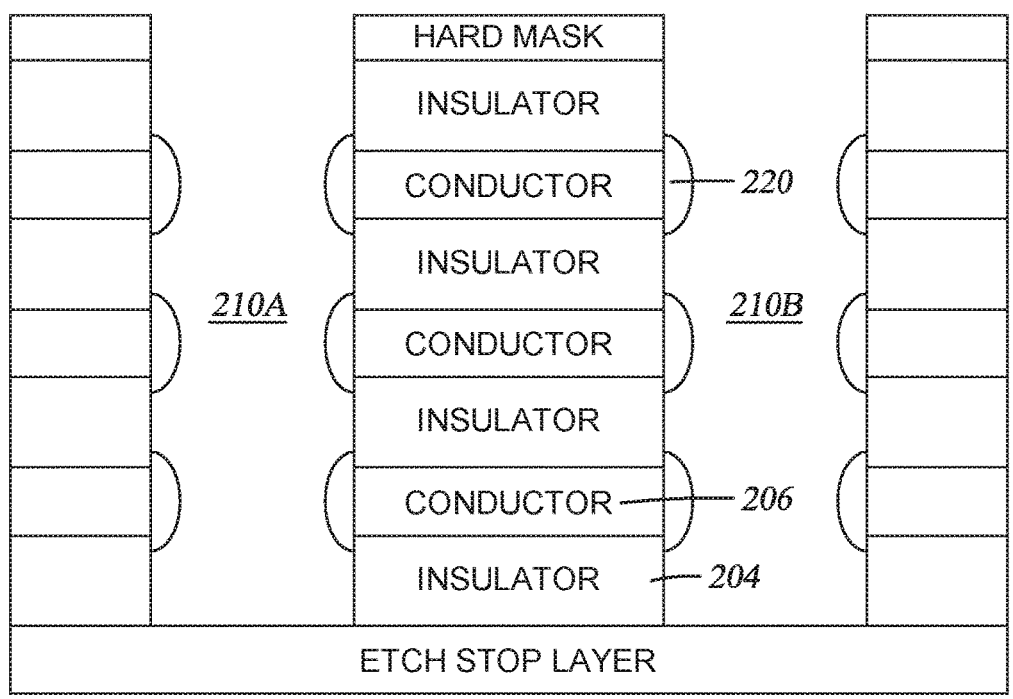
FIG. 2I illustrates the example vertical stack of FIG. 2E where the conductive layers are not recessed, in accordance with certain embodiments of the present disclosure.
Figure 2J:
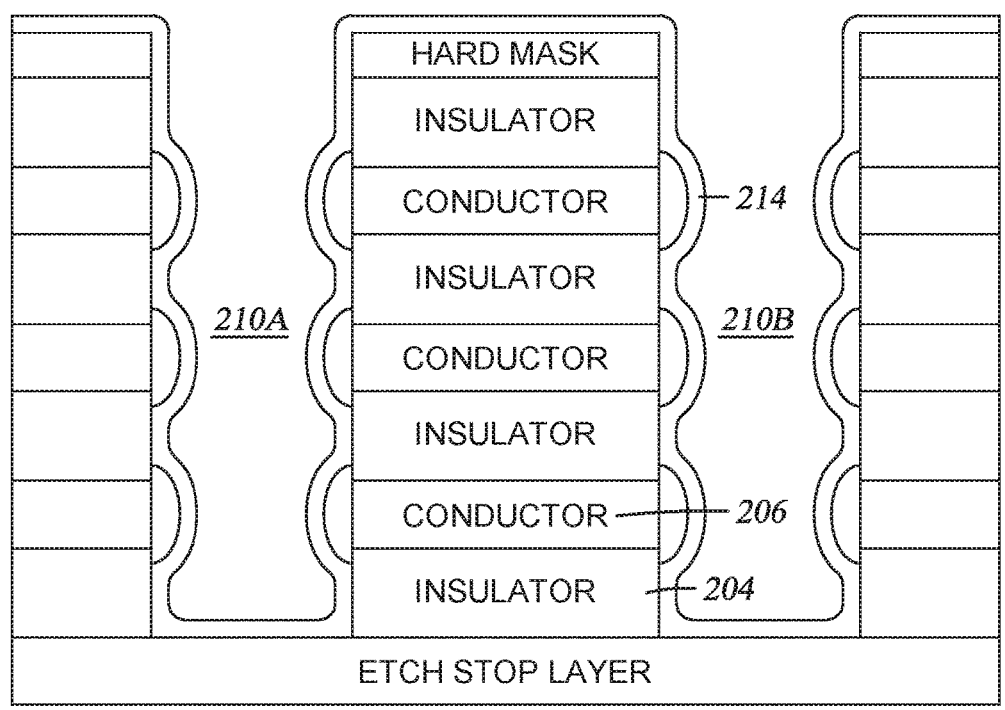
FIG. 2J illustrates the example vertical stack of FIG. 2G where the conductive layers are not recessed, in accordance with certain embodiments of the present disclosure.

In certain embodiments, the conductor layers 206 may not be recessed with respect to the insulator layers 204. For example, as illustrated in FIG. 2I, a horizontal length of the conductor layers 206 are the same as a horizontal length of the insulator layers 204. The plating materials 220 are formed on the conductive layers such that they do not make contact with plating material formed on of an adjacent conductive layer. FIG. 2J illustrates the vertical stack of FIG. 2I, with a contact strip 214 formed over each of the plugs 220.

Figure 3:
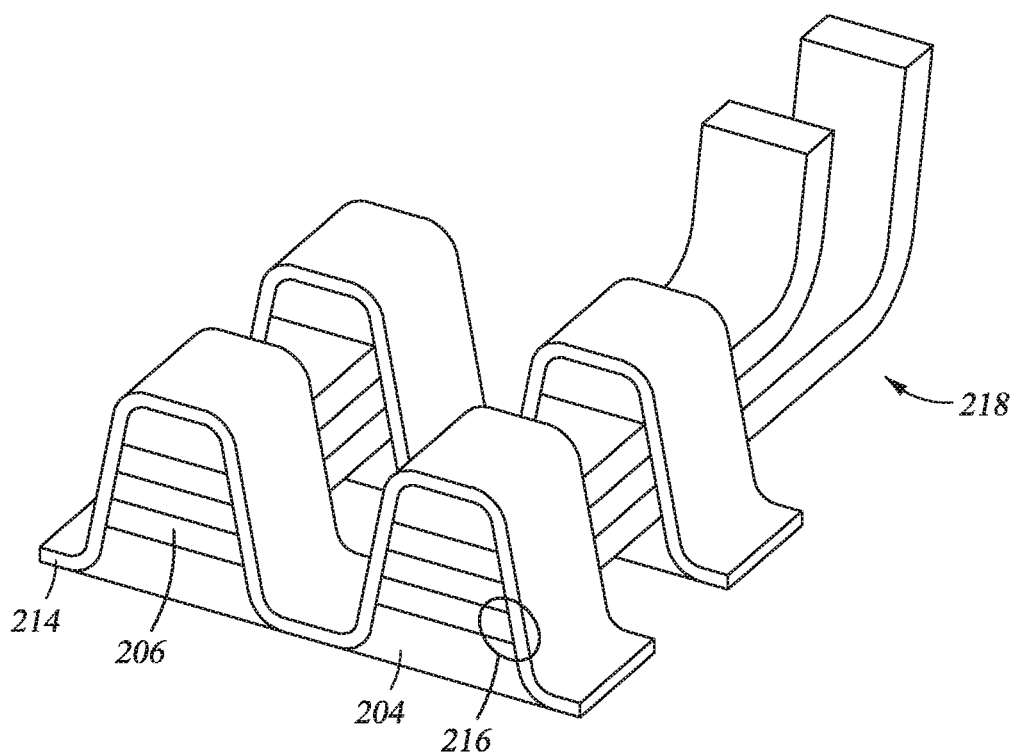
FIG. 3 illustrates an example memory component using alternating layers of conductive and insulator materials, in accordance with certain embodiments of the present disclosure.

FIG. 3 illustrates a plurality of memory cells in a memory device, in accordance with certain embodiments of the present disclosure. As illustrated, conductive layers of adjacent trenches may be connected to form one or more strips 218 of conductive material. The junction 216 between the conductive strip 218 and the contact strip 214 includes the plating material formed during the electroplating process, as described with respect to FIG. 2E.

As presented above, depending on the material used to plate the conductive layers, the junction 216 between the conductive layer and the contact strip 214 may have different electrical properties. For example, in certain embodiments, a material may be used such that the junction 216 has an electric property of a phase change material, such as GeSbTe, SeTe, SiTe, SbSe, SnSe, SnTe, SnSb, GeSb, GeTe, SiSb, and alloys thereof. An electrical behavior of phase change material is characterized by a shift from a blocking state (e.g., effectively an open circuit or highly resistive state) to a resistive state, based on whether a voltage applied to the phase change material reaches a certain threshold.

In other embodiments, a plating material may be used such that the junction 218 has an electric property of an ovonic threshold switch (OTS), such as GeSeBi. An OTS is a two terminal device that shifts from a blocking state (e.g., a high resistive state) to a conductive state based on whether a voltage applied to the OTS reaches a certain threshold.

Each strip 218 may be connected to one or more select devices (e.g., switches), configured to access the junctions 216 between each of the plurality of conductive layers and the contact strip 214. In certain embodiments, the conductive layer edges exposed to the sidewalls of each trench may be electroplated using phase change and/or OTS material to create one or more memory cell. Each memory cell may be controlled by components coupled with strip 218 and contact strip 214, which provide access to each of the junctions 216. That is, the plating material at the junctions 216 form memory cells of a vertical array, where each memory cell is selected via the strips 218 using the select devices. As illustrated, the conductive layers are orthogonal to the vertical array of memory cells.

The PCM and OTS devices disclosed herein are scalable 3D arrangements. It is to be understood that the description herein is not limited to PCM and OTS devices, but rather is applicable to any material with a desired electrical behavior. The embodiments disclosed herein are scalable, yet has a low footprint due to its 3D architecture.

While the foregoing is directed to embodiments of the present disclosure, other and further embodiments of the disclosure may be devised without departing from the basic scope thereof, and the scope thereof is determined by the claims that follow.

What is claimed is:
1. A storage device, comprising:
    a vertical array of memory cells, the vertical array comprising:
        a resist bottom layer disposed over a substrate;
        a stack structure comprising alternating layers of insulator material and conductor material over the resist bottom layer in a vertical direction, wherein the alternating layers are parallel with a surface of the substrate;

a trench formed into the stack structure in the vertical direction; and a plurality of phase change material (PCM) plugs, each PCM plug disposed on an edge of a respective one of the layers of the conductor material, extending into the trench beyond an edge of an adjacent layer of the insulator material, and being separate from one or more adjacent PCM plugs in the vertical direction.

2. The storage device of claim 1, wherein a thickness of a first layer of the conductor material is less than a thickness of one or more layers of the insulator material adjacent to the first layer in the stack structure.

3. The storage device of claim 1, wherein a horizontal length of each layer of the conductor material is less than a horizontal length of each layer of the insulator material.

4. The storage device of claim 1, wherein the conductor material comprises one or more of doped silicon, Molybdenum (Mo), and Tungsten (W).

5. The storage device of claim 1, wherein the layers of the conductor material are recessed from a sidewall of the trench.

6. The storage device of claim 1, wherein the PCM plugs comprise structures formed by an electroplating process.

7. The storage device of claim 1, further comprising a contact strip, the contact strip configured to electrically connect first PCM plugs disposed within the trench to second PCM plugs disposed within another trench formed within the stack structure.

8. The storage device of claim 1, wherein one or more of the PCM plugs are coupled with an ovonic threshold switch.

9. A system, comprising:

a storage device comprising a plurality of memory cells, each memory cell embodied within a respective one of one or more vertical arrays;

a selector device to electrically access the plurality of memory cells;

a first metallic material to vertically connect memory cells of a vertical array of the one or more vertical arrays of the storage device; and a second metallic material connected to an in-plane conductor material which is orthogonal to the vertical array, wherein the vertical array comprises:

a resist bottom layer disposed over a substrate; and a vertical stack comprising alternating layers of in-plane insulator material and the in-plane conductor material over the resist bottom layer, wherein:

an array of trenches are formed into the vertical stack, the in-plane conductor layers and the in-plane insulator layers are parallel with a surface of the substrate, phase change material (PCM) plugs are disposed on edges of respective in-plane conductor layers within said trenches, each PCM plug separate from vertically adjacent PCM plugs within said trenches, a shape of said PCM plugs is hemispherical, a thickness of said PCM plugs is less than a width of said trenches and a thickness of adjacent in-plane insulator layers in said trenches, and a top contact metallic layer is formed on sidewalls of said trenches, such that said PCM plugs are disposed between said edges of said in-plane conductor layers and said top contact layer.

10. The system of claim 9, wherein a thickness of an in-plane conductor layer of the vertical stack is less than a thickness of an in-plane insulator layer of the vertical stack.

11. The system of claim 10, wherein a horizontal length of the in-plane conductor layer is shorter than a horizontal length of the in-plane insulator layer.

12. The system of claim 9, wherein the conductor material comprises one or more of doped silicon, Molybdenum (Mo), and Tungsten (W).

13. The system of claim 9, wherein the edges of said in-plane conductor layers are recessed from sidewalls of said trenches.

14. The system of claim 9, wherein the PCM plugs comprise structures formed by an electroplating process.

15. The system of claim 9, wherein one or more of the PCM plugs are coupled with an ovonic threshold switch.

16. A memory device, comprising:

a vertical array comprising a plurality of memory cells;

a selector device to electrically access the memory cells;

a first metallic material to vertically connect the vertical array of memory cells; and a second metallic material connected to an in-plane conductor material which is orthogonal to the vertical array of memory cells, wherein the vertical array of memory cells comprises:

a vertical stack comprising alternating insulator and conductor layers, the insulating layers comprising an in-plane insulator material and the conductor layers comprising the in-plane conductor material, and a plurality of phase change material (PCM) plugs disposed within an opening through the vertical stack, each PCM plug disposed on an edge of one of the conductor layers within the opening and being vertically separate from others of the plurality of PCM plugs.

17. The memory device of claim 16, wherein the PCM plugs are formed by an electroplating process.

18. The memory device of claim 16, wherein one or more of the PCM plugs are coupled to an ovonic threshold switch element.

19. The memory device of claim 16, further comprising a contact strip formed over the plurality of PCM plugs within the opening.

20. The memory device of claim 19, wherein the contact strip is formed to electronically connect one or more of the PCM plugs disposed within the opening to one or more PCM plugs disposed within another opening in the vertical stack.

* * * * *